United States Patent [19]
Adachi et al.

[11] Patent Number: 6,104,464
[45] Date of Patent: *Aug. 15, 2000

[54] RIGID CIRCUIT BOARD FOR LIQUID CRYSTAL DISPLAY INCLUDING CUT OUT FOR PROVIDING FLEXIBILITY TO SAID BOARD

[75] Inventors: Kohei Adachi; Toru Kokogawa; Takanori Takaki; Hayato Takasago, all of Kikuchi-gun; Mitsumasa Mori; Atsushi Tanaka, both of Amagasaki, all of Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/524,567

[22] Filed: Sep. 7, 1995

[30] Foreign Application Priority Data

Dec. 28, 1994 [JP] Japan .................................. 6-327598

[51] Int. Cl.$^7$ .................................................. G02F 1/1345
[52] U.S. Cl. ............................................. 349/150; 361/749
[58] Field of Search .................................. 349/150, 152, 349/149, 206; 345/206; 174/254, 255; 361/749

[56] References Cited

U.S. PATENT DOCUMENTS

| | | |
|---|---|---|
| 4,993,148 | 2/1991 | Adachi et al. . |
| 5,081,562 | 1/1992 | Adachi et al. . |
| 5,144,534 | 9/1992 | Kober ........................................ 361/398 |
| 5,263,248 | 11/1993 | Kiyoto et al. ............................. 29/846 |
| 5,288,950 | 2/1994 | Ushio et al. . |
| 5,362,547 | 11/1994 | Yamazaki . |
| 5,378,306 | 1/1995 | Cibulsky et al. ......................... 156/630 |
| 5,398,128 | 3/1995 | Tajima et al. ............................. 349/150 |
| 5,419,038 | 5/1995 | Wang et al. ............................... 29/830 |
| 5,518,674 | 5/1996 | Powell et al. ............................ 264/104 |

FOREIGN PATENT DOCUMENTS

| | | |
|---|---|---|
| 0 065 765 | 12/1982 | European Pat. Off. . |
| 0 534 290 | 3/1993 | European Pat. Off. . |
| 43 00899 | 7/1994 | Germany . |
| 4-97586 | 3/1992 | Japan . |
| 4-212495 | 8/1992 | Japan . |
| 4-260021 | 9/1992 | Japan . |

OTHER PUBLICATIONS

*Patent Abstracts of Japan,* vol. 13, No. 181 (E–750), Apr. 27, 1989, JP–A–01 007697.
*Patent Abstracts of Japan,* vol. 16, No. 326 (E–1235), Jul. 16, 1992, JP–A–04 097586.
*Patent Abstracts of Japan,* vol. 17, No. 188 (E–1349), Apr. 13, 1993, JP–A–04 336486.

*Primary Examiner*—Kenneth Parker
*Attorney, Agent, or Firm*—Burns, Doane, Swecker & Mathis, LLP

[57] ABSTRACT

A drive circuit module comprises a board formed of a hard base material having no flexibility, a circuit pattern formed on the board and having a plurality of input terminals and output terminals supported by a flexible insulation film, and a carrying section for carrying a drive LSI and the like on the circuit pattern; characterized in that the board is provided with at least one cutout on a surface opposite to the surface on which the circuit pattern of the board is formed, thereby making flexible the board in a direction in which the output terminal surface and the carrying section surface are different from each other.

4 Claims, 10 Drawing Sheets

RIGID CIRCUIT BOARD FOR LIQUID CRYSTAL DISPLAY INCLUDING CUT OUT FOR PROVIDING FLEXIBILITY TO SAID BOARD

BACKGROUND OF THE INVENTION

The present invention relates to a circuit board for liquid crystal display, a circuit module, a liquid crystal display device using them, and a method for producing the same.

A liquid crystal display device is generally configured such that the device has a liquid crystal panel in which a liquid crystal material is held between two opposing boards, a circuit section for driving the liquid crystal panel, and a lighting device disposed behind the above-mentioned liquid crystal panel. The above-mentioned circuit section, for example in an active-type liquid crystal display device, comprises a TCP (tape carrier package) carrying a drive LSI for a source or a gate for inputting a signal from a source electrode wiring or a gate electrode wiring on the periphery of the liquid crystal panel and driving a TFT (thin film transistor) contained in the above-mentioned liquid crystal panel, and a bus board for supplying a source voltage, a ground voltage and a video signal to the TCP.

Figure 12:
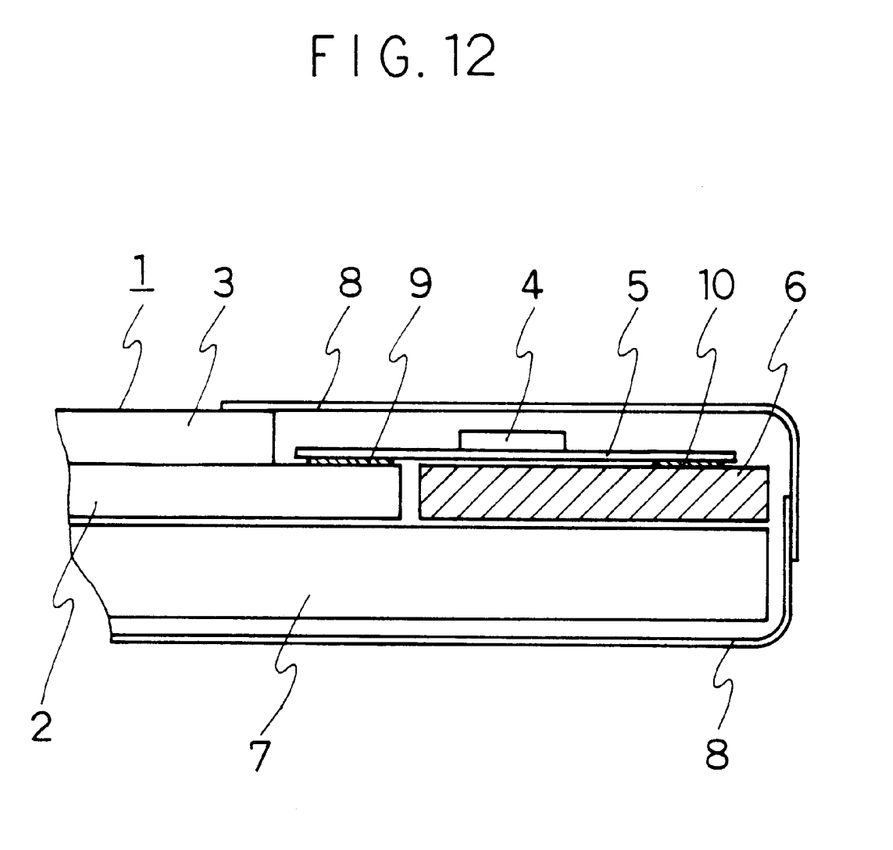
FIG. 12 is a cross sectional view of showing one example of a conventional liquid crystal display device.

FIG. 12 is a sectional view showing a circuit section of a conventional liquid crystal display device, wherein numeral 1 designates a liquid crystal panel; numeral 2, a TFT board in which a TFT of the liquid crystal panel 1, and a gate electrode wiring and a source electrode wiring of the TFT are formed and which has wiring terminals connected to the above-mentioned gate electrode wiring and source electrode wiring on the periphery thereof; numeral 3, a color filter board; numeral 4, a drive LSI; numeral 5, a TCP which carries the drive LSI and has an input terminal and an output terminal; numeral 6, a bus board: numeral 7, a lighting device provided behind the liquid crystal panel 1; numeral 8, an outer casing frame; numeral 9, an anisotropy conductive film; and numeral 10, a connecting member.

The output terminal of the TCP 5 carrying one drive LSI 4 is connected through the anisotropy conductive film 9 to the wiring terminal of the TFT board, while the input terminal of the TCP 5 is connected through the connecting member 10 to the bus board 6.

In the above-mentioned manner, the TCP 5 and the bus board 6 connected through the anisotropy conductive film 9 to the liquid crystal panel 1 are disposed horizontally to the plane of the liquid crystal panel 1, provided with the lighting device 7 behind the liquid crystal panel 1, and covered with the outer casing frame 8.

Figure 13:
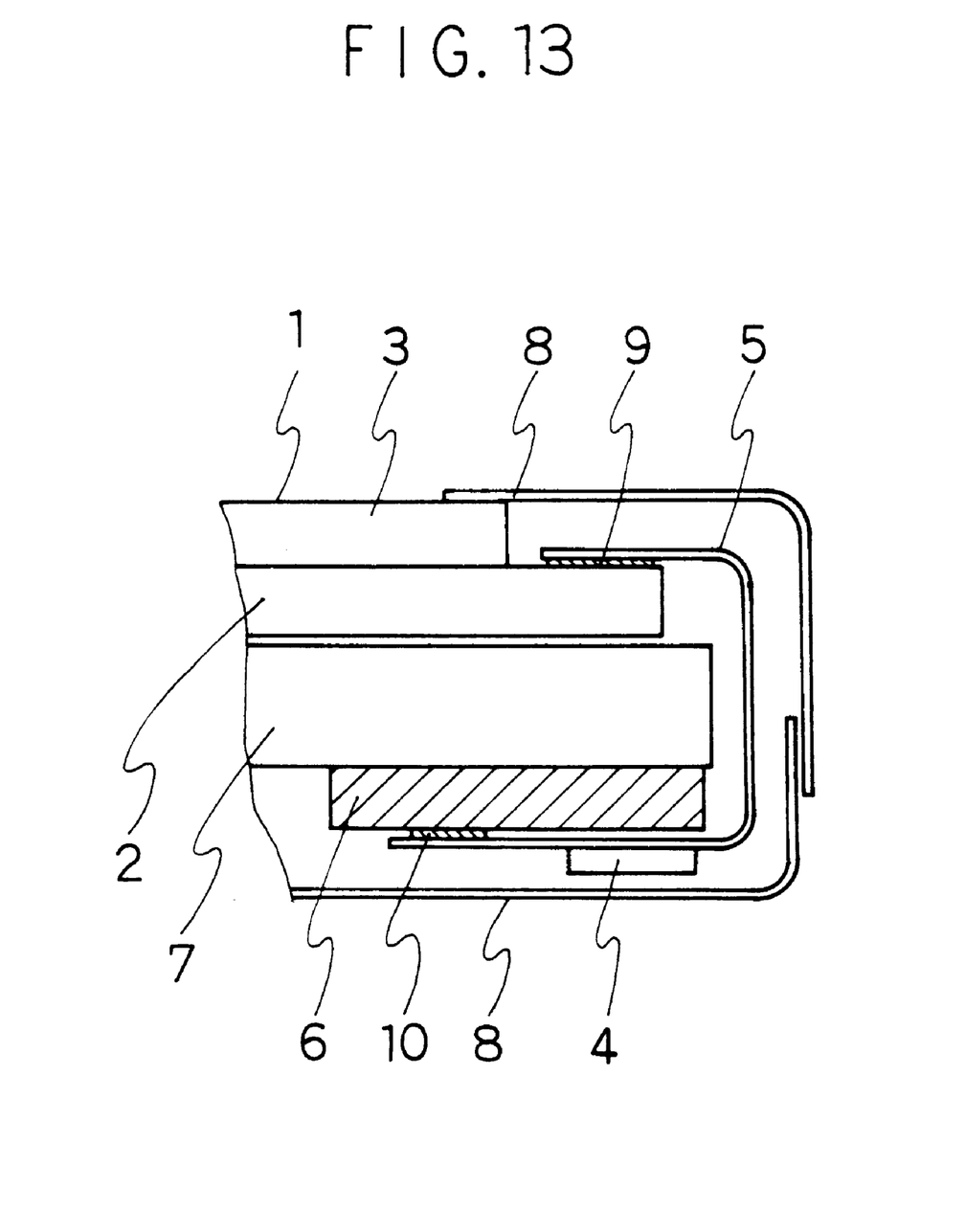
FIG. 13 is a cross sectional view of showing another example of a conventional liquid crystal display device.

FIG. 13 shows a configuration in which the TCP 5 connected to the liquid crystal panel 1 is bent in a manner to surround the lighting device 7 by utilizing the flexibility of the TCP 5 so that the LSI 4 and the bus board 6 are disposed behind the lighting device 7.

In the configuration of. FIGS. 12 and 13, a method of connecting the output terminal of the TCP 5 to the wiring terminal formed on the TFT panel 2 of the liquid crystal panel 1 is performed by a method of positioning one by one a plurality of TCPs 5 punched from a reel-shaped tape carrier on the wiring terminal of the TFT board 2 and then heating and pressurizing the anisotropy conductive film 9 previously and temporarily pressure bonded to the wiring terminal of the TFT board 2 or the output terminal of the TCP 5.

Also, the input terminal of the TCP 5 and the bus board 6 are connected to each other by means of a solder reflow technique, soldering or the anisotropy conductive film 9.

Figure 14:
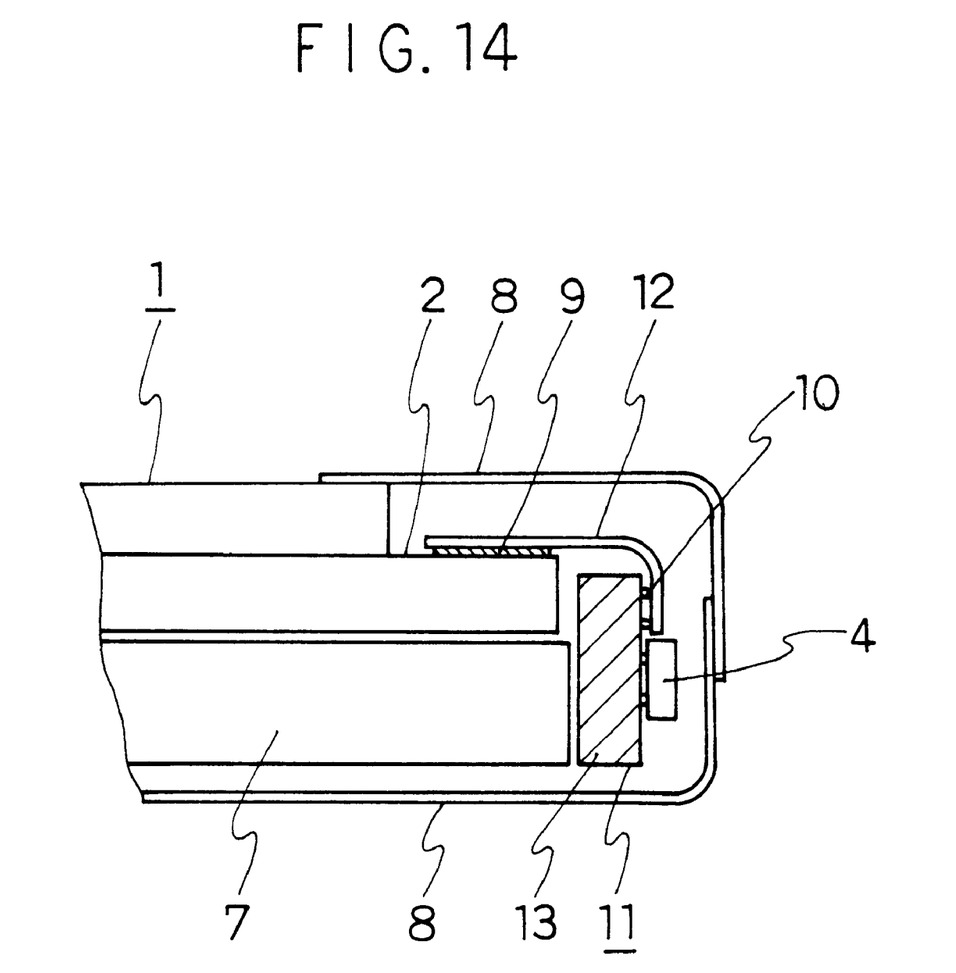
FIG. 14 is a cross sectional view of showing still another example of a conventional liquid crystal display device.

In the configuration of FIGS. 12 and 13, the drive LSI 4 is connected one by one to the liquid crystal panel 1, while FIG. 14 is a sectional view of a liquid crystal display device in which a plurality of drive LSIs 4 are simultaneously connected to the liquid crystal panel 1. In FIG. 14, numeral 1 designates a liquid crystal panel; numeral 11, a drive circuit module for driving the liquid crystal panel 1; numeral 12, a flexible connecting member having a width of one side of the liquid crystal panel, such as a heat seal formed of a polyester resin connecting an output terminal of the drive circuit module to a wiring terminal of the TFT board 2; numeral 7, a lighting device provided behind the liquid crystal panel 1; and numeral 8, an outer casing frame; wherein the drive circuit module 11 carries a plurality of drive LSIs 4 for a source or a gate on a circuit board 13, and the drive circuit module 11 is disposed on one side of or behind the lighting device 7 by utilizing a flexibility of the flexible connecting member 12.

In the liquid crystal display device showing in FIG. 14, a plurality of drive LSIs 4 are installed by means of a flip chip or a wire bonding technique on the circuit board 13 in which a circuit is formed on a board formed of an inorganic material, an organic material or a metal to form the drive circuit module 11; an input terminal of the flexible connecting member 12 is positioned to be aligned, thereby connecting to an output terminal of the circuit board 14; an output terminal of the flexible connecting member 12 is positioned to be aligned, thereby connecting by means of a thermal pressure bonding and the like to the wiring terminal of the TFT board 2; and a plurality of drive LSIs 4 are simultaneously connected to reduce manhour.

As described above, the conventional liquid crystal display device has had disadvantages that the TCP 5 and the bus board 6 are disposed in the direction horizontal to the liquid crystal panel 1 or behind the lighting device 7, whereby a frame portion of the outer periphery of the liquid crystal display device or widthwise size thereof becomes large, and that the drive LSIs 4 are one by one connected to the liquid crystal panel 1, thereby increasing the number of manhours.

Also, a method of forming the drive circuit module 11 carrying a plurality of drive LSIs 4 and at the same time, connecting a plurality of drive LSIs 4 to the liquid crystal panel 1, thereby increasing the number of manhours has had a disadvantage that unlike that of positioning to be aligned in the output terminal of individual TCPs 5 with a part of the wiring terminal, the output terminal of the flexible connecting member 12 is required to be connected to one side of the output terminal of the circuit board 13 and also to one side of the wiring terminal, so that the flexible connecting member 12 when thermally pressure bonded expands to cause a deviation in the pitch between terminals to become large.

An object of the present invention is to solve the above-mentioned problems, and to provide a drive circuit module for liquid crystal display device which is bendable and has a high productivity without developing a deviation in the pitch between terminals, provide a compact liquid crystal display device which uses the drive circuit module and is small in outer periphery size and thin in outer shape thickness, and provide a method of manufacturing the same.

SUMMARY OF THE INVENTION

The invention in connection with claim 1 is a drive circuit module comprising a board formed of a hard base material having no flexibility, a circuit pattern formed on the board and having a plurality of input terminals and output terminals supported by a flexible insulation film, and a carrying section for carrying a drive LSI and the like on the circuit pattern, and which is provided with at least one cutout on a surface opposite to the surface on which the above-mentioned circuit pattern of the above-mentioned board has been formed, thereby making flexible the above-mentioned board in a direction in which the above-mentioned output terminal surface and carrying section surface and different from each other.

The invention in connection with claim 3 is a drive circuit module comprising a board formed of a hard base material having no flexibility, a circuit pattern formed on the board and having a plurality of input terminals and output terminals supported by a flexible insulation film, and a carrying section for carrying a drive LSI and the like on the circuit pattern, and which is provided with at least two cutouts on a surface opposite to the surface on which the above-mentioned circuit pattern of the above-mentioned board is formed, and provided with a separation layer on the above-mentioned board of the above-mentioned circuit pattern surface corresponding to the cutout spacing, thereby making flexible the above-mentioned board in a direction in which the above-mentioned output terminal surface and carrying section surface are different from each other, and making removable the above-mentioned board in contact with the above-mentioned separation layer.

The invention in connection with claim 9 is a circuit board comprising a board formed of a hard base material having no flexibility, and a circuit pattern formed on the board and having a plurality of input terminals and output terminals supported by a flexible insulation film, and which is provided with at least one cutout on a surface opposite to the surface on which the above-mentioned circuit pattern of the above-mentioned board has been formed, thereby making flexible the above-mentioned board.

The invention in connection with claim 11 is a circuit board which has a board formed of a hard base material having no flexibility, and a circuit pattern formed on the board and supported by a flexible insulation film, and which is provided with at least two cutouts on a surface opposite to the surface on which the above-mentioned circuit pattern of the above-mentioned board is formed, and provided with a separation layer on the above-mentioned board of the above-mentioned circuit pattern surface corresponding to the cutout spacing, thereby making flexible the above-mentioned board, and making removable the above-mentioned board in contact with the above-mentioned separation layer.

The invention in connection with claim 15 is a liquid crystal display device provided with a TFT board forming wiring terminals connected to a gate electrode wiring and a source electrode wiring of a TFT, and with a drive circuit module which has a board formed of a hard base material having no flexibility, a circuit pattern formed on the board and having a plurality of input terminals and output terminals supported by a flexible insulation film, and a carrying section for carrying a drive LSI and the like on the circuit pattern and which is provided with at least one cutout on a surface opposite to the surface on which the above-mentioned circuit pattern of the above-mentioned board has been formed, and provided with a separation layer on the above-mentioned board of the above-mentioned circuit pattern surface corresponding to the cutout spacing, thereby making flexible the above-mentioned board in the direction in which the above-mentioned output terminal surface and carrying section surface are different from each other, and making removable the above-mentioned board in contact with the above-mentioned separation layer, and in the liquid crystal display device, the above-mentioned wiring terminal being connected with the above-mentioned output terminal.

The invention in connection with claim 17 is a liquid crystal display device provided with a TFT board forming wiring terminals connected to a gate electrode wiring and a source electrode wiring of a TFT, and with a drive circuit module which has a board formed of a hard base material having no flexibility, a circuit pattern formed on the board and having a plurality of input terminals and output terminals supported by a flexible insulation film, and carrying section for carrying a drive LSI and the like on the circuit pattern and which is provided with at least two cutouts on a surface opposite to the surface on which the above-mentioned circuit pattern of the above-mentioned board is formed, and provided with a separation layer on the above-mentioned board of the above-mentioned circuit pattern surface corresponding to the cutout spacing, thereby making flexible the above-mentioned board in the direction in which the above-mentioned output terminal surface and carrying section surface are different from each other, and making removable the above-mentioned board in contact with the above-mentioned separation layer, and in the liquid crystal display device, the above-mentioned wiring terminal being connected with the above-mentioned output terminal.

The invention in connection with claim 27 is a method of manufacturing a drive circuit module comprising steps of forming a circuit pattern having a plurality of input terminals and output terminals supported by a flexible insulation film on a board formed of a hard base material having no flexibility, installing a drive LSI and the like on the circuit pattern on a carrying section, and providing at least one cutout on a surface opposite to the surface on which the above-mentioned circuit pattern of the above-mentioned board has been formed, thereby making flexible the above-mentioned board in a direction in which the above-mentioned output terminal surface and carrying section surface are different from each other.

The invention in connection with claim 23 is a method of manufacturing a drive circuit module comprising steps of providing a separation layer on a board formed of a hard base material having no flexibility, forming a circuit pattern having a plurality of input terminals and output terminals supported by a flexible insulation film covering the separation layer, installing a drive LSI and the like on the circuit pattern on a surface opposite to the surface on which the above-mentioned separation layer under the above-mentioned circuit pattern of the above-mentioned board has been formed, thereby making flexible the above-mentioned board in a direction in which the above-mentioned board in contact with the above-mentioned separation layer.

The invention in connection with claim 24 is a method of manufacturing a circuit board comprising steps of forming a circuit pattern supported by a flexible insulation film on a board formed of a hard base material having no flexibility, and providing at least one cutout on a surface opposite to the surface on which the above-mentioned circuit pattern of the above-mentioned board has been formed, thereby making flexible the above-mentioned board.

The invention in connection with claim 25 is a method of manufacturing a liquid crystal display device comprising steps of providing a separation layer on a board formed of a hard base material having no flexibility, forming a circuit pattern supported by a flexible insulation film covering the separation layer, and providing at least two cutouts on a surface opposite to the surface on which the above-mentioned separation layer under the above-mentioned circuit pattern of the above-mentioned board has been formed, thereby making flexible the above-mentioned board, and making removable the above-mentioned board in contact with the above-mentioned separation layer.

The invention in connection with claim 26 is a method of manufacturing a liquid crystal display device comprising steps of: connecting a wiring terminal of a TFT board forming wiring terminals connected to a gate electrode wiring and a source electrode wiring of a TFT to an output terminal of a drive circuit module which has a board formed of a hard base material having no flexibility, a circuit pattern formed on the board and having a plurality of input terminals and output terminals supported by a flexible insulation film, and a carrying section for carrying a drive LSI and the like on the circuit pattern, and which is provided with at least one cutout on a surface opposite to the surface on which the above-mentioned circuit pattern of the above-mentioned board has been formed, thereby making flexible the above-mentioned board in a direction in which the above-mentioned output terminal surface and carrying section surface are different from each other; and bending the above-mentioned board at the above mentioned output.

The invention in connection with claim 27 is a method of manufacturing a liquid crystal display device comprising steps of: connecting a wiring terminal of a TFT board forming wiring terminals connected to a gate electrode wiring and a source electrode wiring of a TFT to an output terminal of a drive circuit module which has a board formed of a hard base material having no flexibility, a circuit pattern formed on the board and having a plurality of input terminals and output terminals supported by a flexible insulation film, and a carrying section for carrying a drive LSI and the like on the circuit pattern, and which is provided with at least two cutouts on a surface opposite to the surface on which the above-mentioned circuit pattern of the above-mentioned board has been formed, and provided with a separation layer on the above-mentioned board of the above-mentioned circuit pattern surface corresponding to the cutout spacing, thereby making flexible the above-mentioned board in a direction in which the above-mentioned output terminal surface and carrying section surface are different from each other, and making removable the above-mentioned board in contact with the above-mentioned separation layer; removing the above-mentioned board in contact with the above-mentioned separation layer; and bending the above-mentioned board.

According to the present invention in connection with claims 1 to 7, 22 and 23, there is obtained the drive circuit module in which bending at the cutout allows a change in the direction of the output terminal formed with a fine pitch at a high accuracy and of the carrying section carrying the drive LSI, and the circuit pattern is supported by th flexible insulation layer, thereby keeping a function of the circuit pattern without being cut.

Also, there is obtained the drive circuit module in which the circuit pattern is formed on the board having no flexibility, so that even heating the board, there are little elongation and warpage, and no deviation in the pitch of the output terminal.

According to the present invention in connection with claim 9 through 14, 24 and 25, there is obtained by circuit board in which bending at the cutout allows a change in the direction of the circuit pattern, and the circuit pattern is supported by the flexible insulation layer, thereby keeping a function of the circuit pattern without being cut.

According to the present invention in connection with claims 18 to 21, 26 and 27, the overall size of the liquid crystal display device can be made small by connecting the wiring terminal of the TFT board to the output terminal of the drive circuit module in which bending at the cutout allows a change in the direction of the output terminal formed with a fine pitch at a high accuracy and of the carrying section carrying the drive LSI, and the circuit pattern is supported by the flexible insulation layer, thereby keeping a function of the circuit pattern without being cut.

Also, there is obtained the drive circuit module in which the circuit pattern is formed on the board having no flexibility, so that even heating the board, there are little elongation and warpage, and no deviation in the pitch in the connection of the wiring terminal of the TFT board to the output terminal of the drive circuit module.

According to the present invention in connection with claims 3 and 23, by removing the board in contact with the separation layer, there is obtained the drive circuit module having a large degree of freedom in bending such as bending angle and bending direction.

According to the present invention in connection with claims 11 and 25, by removing the board in contact with the separation layer, there is obtained the circuit board having a large degree of freedom in bending such as bending angle and bending direction.

According tot he present invention in connection with claims 17 and 27, the overall size of the liquid crystal display device can be made smaller by the use of the drive circuit module having a large degree of freedom in bending such as bending angle and bending direction obtained by removing the board in contact with the separation layer.

BRIEF DESCRIPTION OF THE DRAWINGS

FIGS. 1(*a*) and 1(*b*) are, respectively, a plan view and a cross sectional view showing a drive circuit module of one embodiment of the present invention;

FIGS. 7(*a*) and 7(*b*) are, respectively, a partially cutaway perspective view of a liquid crystal display device wherein the drive circuit module of FIG. 1 is employed and a cross sectional view taken along then lines A—A of FIG. 7(*a*);

DETAILED DESCRIPTION

EXAMPLE 1

Figure 1A:
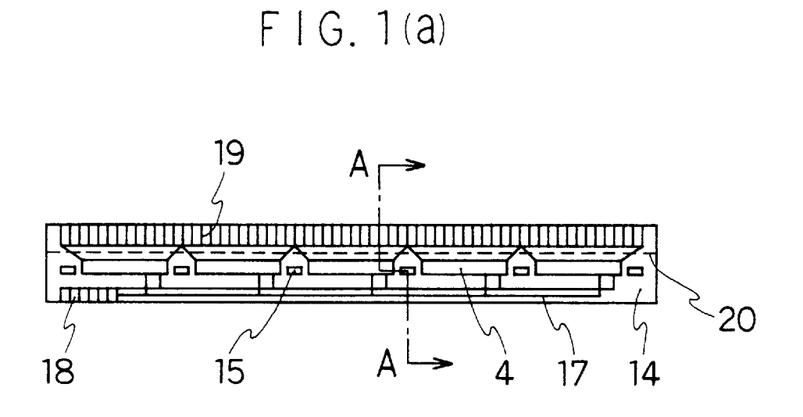
Figure 1B:
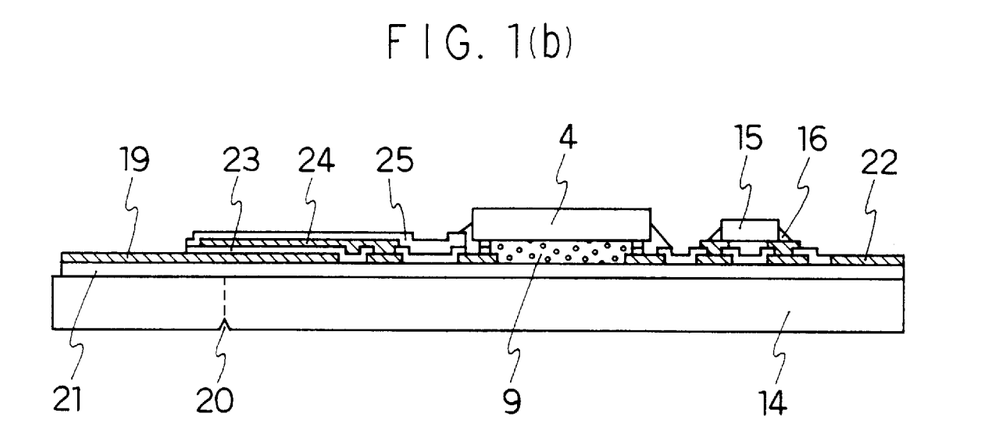

FIGS. 1(a) and 1(b) are each drive circuit module used in a liquid crystal display device embodied in an Example 1 of the present invention, wherein 1(a) is a plan view, and 1(b) is an expanded sectional view taken on line A—A of FIG. 1(a).

In FIGS. 1(a) and 1(b), numeral 14 designates a ceramic board formed of glass or alumina; numeral 4, a drive LSI; numeral 19, an anisotropy conductive film; numeral 15, a chip parts; numeral 16, a solder; numeral 17, a bus line; numeral 18, an input terminal; numeral 19, an output terminal; numeral 20, a scribe line provided on a surface on the side opposite to a glass board 14; numeral 21, a base insulation layer formed of a flexible material such as a polyimide and the like; numeral 22, a first layer conductor formed of copper and the like; numeral 23, an interlayer insulation film formed of a polyimide and the like; numeral 24, a second layer conductor formed of copper and the like; and numeral 25, a surface insulation layer formed of a polyimide and the like.

Manufacturing method will be explained hereinafter.

First, a photosensitive or non-photosensitive polyimide is applied to the ceramic board 14 formed of soda glass, bolosilicate glass or alumina with a thickness of 0.5 to 1.1 mm to form the base insulation layer 21 with a thickness of 5 to 10 μm.

Subsequently, by means of a spattering technique or an electroless plating technique, a primary copper film with a thickness of 100 to 500 nm is formed on the base insulation layer 21;, a plating resist film is formed on the primary copper to remove the resist of a circuit pattern; and then copper plating is applied to form the first layer conductor 22 with a thickness of 3 to 10 nm.

Subsequently, a polyimide with a thickness of 5 to 10 μm is formed into a desired pattern to form the interlayer insulation layer 23; then as with the first layer conductor, the second layer conductor 24 is formed on the interlayer insulation layer 23; and then a polyimide film is formed to form the surface insulation layer 25. Thereafter, the scribe line (cutout) 20 used for bending the ceramic board 14 at a position on the side opposite to the output terminal 19 of the ceramic board 14 is formed by use of a diamond wheel.

Further, by means of a solder reflow technique, the chip parts 15 is connected to a carrying section with the solder 16, and using the anisotropy conductive film 9, the drive LSI 4 is carried by means of a thermal pressure bonding technique at a specified position to manufacture the drive circuit module.

According to this example, bending at the scribe line 20 allows a change in the direction of the output terminal 19 formed with a fine pitch at a high accuracy and of the carrying section carrying the chip parts and the drive LSI, and at the same time, the first layer conductor 22 and the second layer conductor 24 are held between the base insulation layer 21 and the interlayer insulation film 23 and between the interlayer insulation film 23 and the surface insulation layer 25, respectively, thereby allowing their function to be kept without being cut due to their flexibility.

Also, formed on the ceramic board 14 are the base insulation layer 21, the first layer conductor 22, the interlayer insulation layer 23, the second layer conductor 24 and the surface insulation layer 25, so that there are little elongation and warpage, and no deviation in the pitch of the output terminal 19 of the first layer conductor 22.

Although this example shows an example in which one scribe line 20 is formed, a plurality of the scribe lines 20 may be formed at specified places.

EXAMPLE 2

Figure 2:
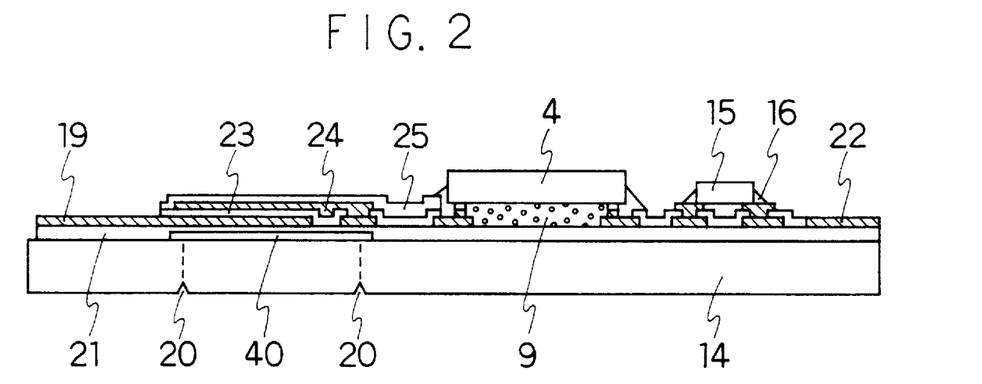
FIG. 2 is a cross sectional view showing a drive circuit module of another embodiment of the present invention.

FIG. 2 is a sectional view showing an example 2 of a drive circuit module for a liquid crystal display device according to the present invention In FIG. 2, numeral 40 designates a separation layer formed of a silicon-type ink or a gold evaporation film; and numeral 20, a scribe lines formed at two places on a surface on the side opposite to the separation layer 40 of the ceramic board 14; the other configuration is the same as Example 1.

The drive circuit module with the above-mentioned configuration is manufactured by screen printing a silicon-type ink or evaporating gold at a specified position on the ceramic board 14 to form the separation layer 26, thereafter, as with Example 1, forming sequentially the base insulation layer 21, the first layer conductor 22, the interlayer insulation layer 23, the second layer conductor 24 and the surface insulation layer 25, and forming two places of the scribe lines 20 on a surface on the side opposite to the separation layer 40 on the ceramic board 14.

Thereafter, as with the Example 1, the module is manufactured by carrying the chip parts 15 and the drive LSI 4 at a specified position, then bending the board at two places of the scribe lines 20, and removing the ceramic board 14 between the scribe lines 20 which is in contact with the separation layer 40 and weak in adhesive power.

According to this example, an action and effect similar to those of Example 1 are obtained, and further, the degree of freedom of bending such as bending angle and bending direction becomes large.

Also, in this example, it will be appreciated that the ceramic board 14 may employ a board formed of an organic material or a metal.

EXAMPLE 3

Figure 3:
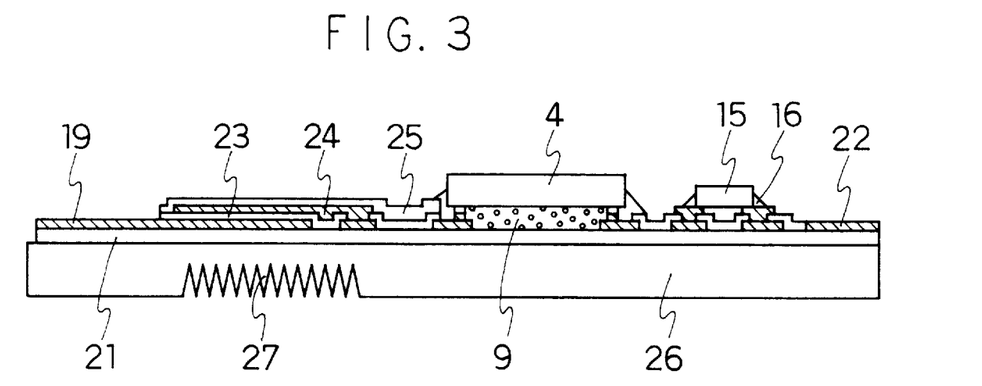
FIG. 3 is a cross sectional view showing a drive circuit module of still another embodiment of the present invention.

FIG. 3 is a sectional view showing an Example 3 of a drive circuit module for a liquid crystal display device according to the present invention. In FIG. 3, this example is the same in configuration as the Example 1, except that numeral 26 designates an organic-type board using an organic-type material such as a glass epoxy or a glass polyimide as a base material, and that a cutout such as a cut groove 27 is formed on a surface on the side opposite to the output terminal 19.

The drive circuit module with the above-mentioned configuration is manufactured by forming sequentially the base insulation layer 21, the first layer conductor 22, the interlayer insulation layer 23, the second layer conductor 24 and the surface insulation layer 23, the second layer conductor 24 and the surface insulation layer 25 on the organic-type board 26 as with the Example 1, and forming the cut groove 27 on a surface on the side opposite to the output terminal 19 of the organic-type board 26.

Thereafter, as with Example 1, the module is manufactured by carrying the chip parts 15 and the drive LSI 4 at a specified position.

According to this example, there is provided the cut groove 27, at which the thickness of the organic-type board 26 is made thin, so that the board can be easily bent, and the direction of the output terminal 19 formed with a fine pitch at a high accuracy and of the carrying section carrying the chip parts 15 and the drive LSI can be changed, and at the same time, the first layer conductor 22 and the second layer conductor 24 are held between the base insulation layer 21 and the interlayer insulation film 23 and between the interlayer insulation film 23 and the surface insulation layer 25, respectively, thereby allowing their function to be kept without being cut due to the flexibility of the insulation layer and the insulation film.

Also, the hard organic-type board 26 is strong to heating and has less deformation, so that there is less deviation in the pitch of and less deformation of the output terminal 19.

Figure 4:
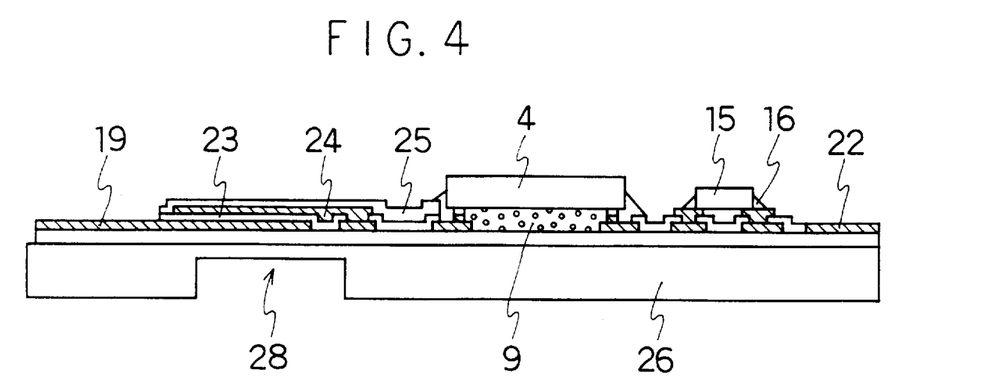
FIG. 4 is a cross sectional view showing a drive circuit module of yet another embodiment of the present invention.

In this example, a metallic material such as aluminium and copper in place of the organic-type board 26 may be used, and even where a cutout 28 like a counter boring groove in place of the groove 27 is formed as shown in FIG. 4, a similar effect is obtained.

Figure 5:
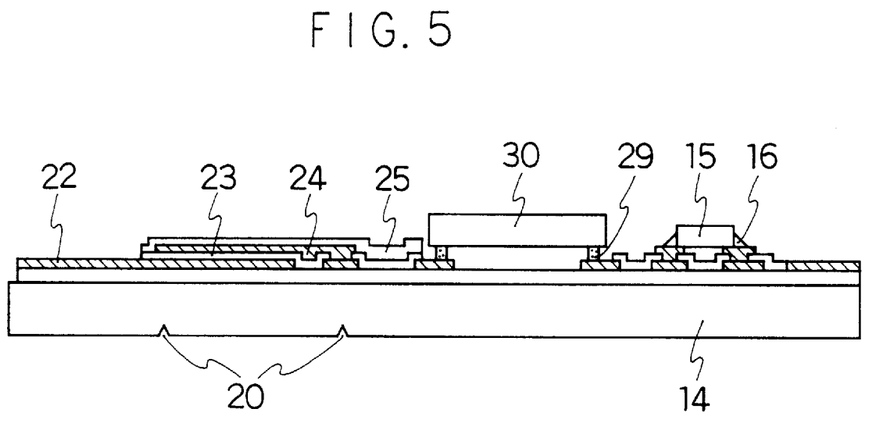
FIG. 5 is a cross sectional view showing the drive circuit module of FIG. 2 on which a bump is formed.

In the above-mentioned Example 1 through 3, a material used for the board needs that formed of a hard base material. As shown in FIG. 5, with a solder plating applied to the first layer conductor 22, a drive LSI 30 having a bump may also be positioned to be aligned and connected by means of a solder reflow technique to the carrying section of the first layer conductor 22, while a chip parts having a bump may also by used.

Figure 6:
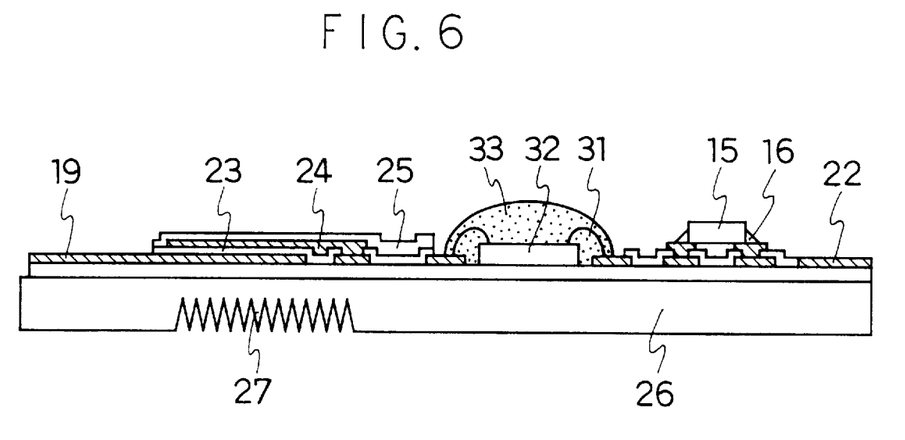
FIG. 6 is a cross sectional view showing the drive circuit module of FIG. 3 on which a bare chip is provided.

Further, as shown in FIG. 6, there may be employed the so-called gold wire bonding technique in which using a drive LSI 32 formed of a bear chip, the first layer conductor 22 to which Ni-Au plating is applied is connected with a gold wire 31 to a drive LSI 33; and the drive LSI 32 and the gold wire 31 being molded with a mold resin.

EXAMPLE 4

Figure 7A:
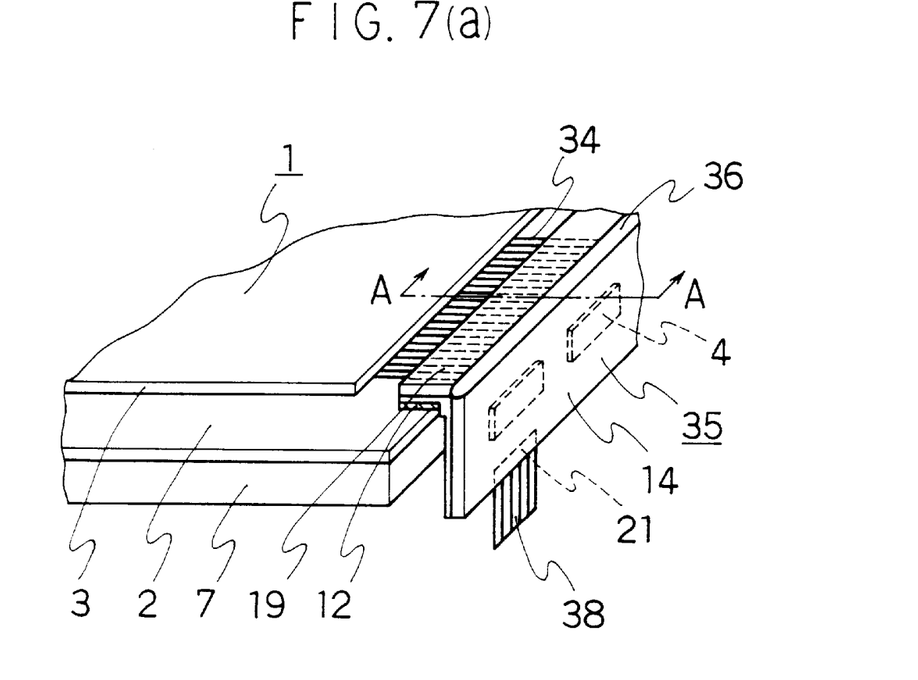
Figure 7B:
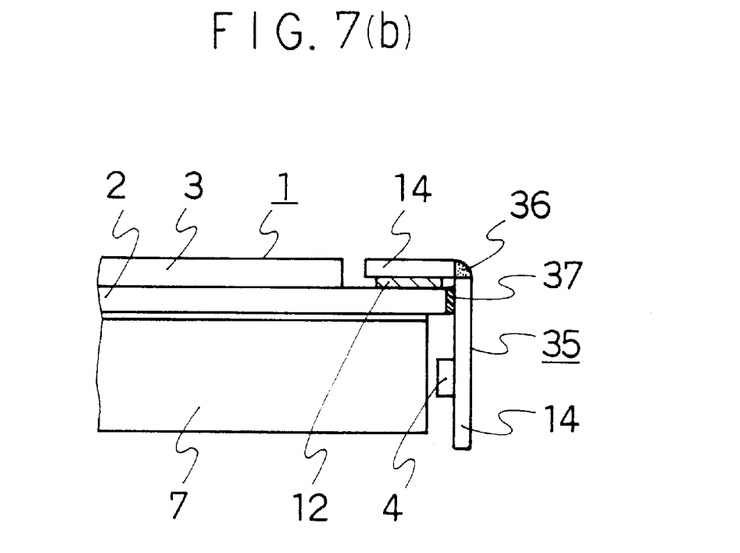

FIGS. 7(*a*) and 7(*b*) are each example of a liquid crystal display device using a drive circuit module of the example 1 according to the present invention, wherein FIG. 7(*a*) is a perspective view when an outer casing frame is removed, and FIG. 7(*b*) is a sectional view taken on line A—A of FIG. 7(*a*).

In FIG. 7, numeral 1 designates a liquid crystal panel, which has the TFT board 2 formed with a wiring terminal 34 connected to the source electrode wiring or the gate electrode wiring, the color film board 3, and an outer casing frame not shown; and numeral 35 designates a drive circuit module in which the ceramic board 14 formed with the output terminal 19 connected to the wiring terminal 34 and the ceramic board 14 carrying the drive LSI 4 are bent perpendicularly to each other, the bent edge is reinforced with a reinforcing resin 36 and fixed with a UV curable resin 37 to the end surface of the TFT board 2, and an input cable 38 is connected to the input terminal 21. Numeral 39 designates a laminated film formed of a circuit pattern and an insulation layer.

A method of connecting the drive circuit module 35 to the liquid crystal panel 1 will be explained. First, an anisotropy conductive film 12 is temporarily pressure bonded to the output terminal 19 of the drive circuit module 35 or to the wiring terminal 34 of the liquid crystal panel 1.

Then, the terminal row of the wiring terminal 34 is positioned to be aligned with that of the output terminal 19, and then the rows are thermally pressure bonded by the use of a heating head from the upper side of the ceramic board 14 to melt the anisotropy conductive film 12, thereby connecting collectively both the terminal rows.

The ceramic board 14 is previously provided with a scribe line on the back on the side of the output terminal 19, so that applying a force from the scribe line side causes the ceramic board 14 to be easily cut.

Then, the ceramic board 14 thus bent is fixed with the UV curable resin 37 to the end surface of the TFT board 2, and a protective coat resin 36 is applied to the bent portion to protect and cure.

The first and the second layer conductors are in a condition that they are held between the flexible film and between the interlayer insulation film and the surface insulation layer, respectively, so that they are not cut and keep their function and thus can be bent perpendicularly as shown FIG. 7, thereby allowing the overall size of the liquid crystal display device to be reduced.

The ceramic board 14 has little elongation and warpage due to thermal pressure bonding, so that there is no deviation in the pitch of the terminal row of the output terminal 19 and the terminal row of the wiring terminal 34 of the liquid crystal panel 1.

Figure 8:
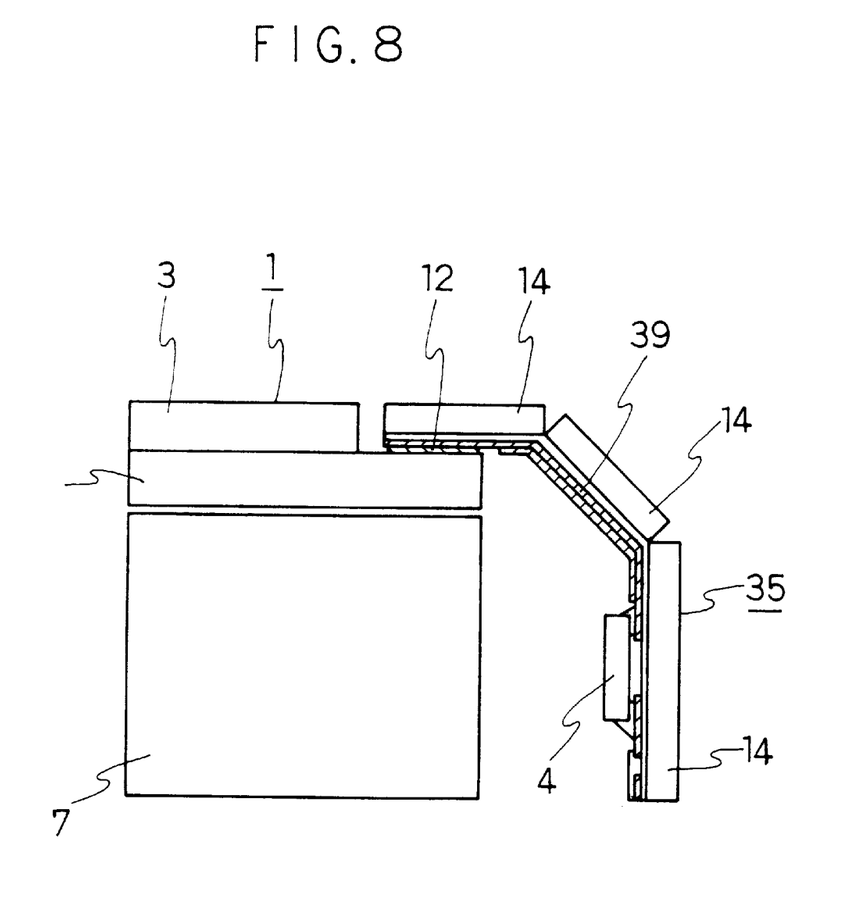
FIG. 8 is a cross sectional view of a liquid crystal display device wherein the driving circuit module of FIG. 1 is employed.

Although this example shows a case where the number of the scribe lines is one, a plurality of scribe lines may also be provided, and as shown in FIG. 8, the board be bent at arbitrary places to arrange the drive circuit module 35 on the back of the lighting device 7.

Figure 9:
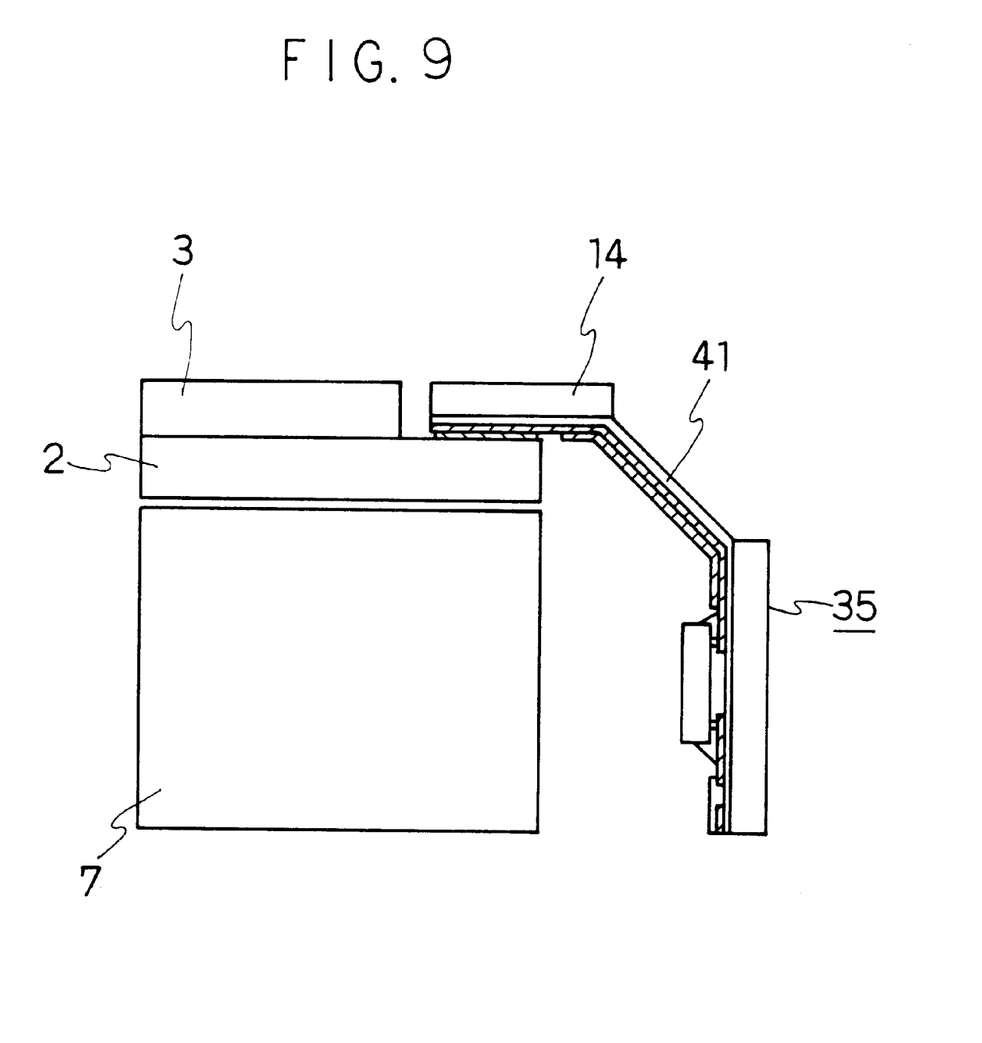
FIG. 9 is a cross sectional view of a liquid crystal display device wherein the driving circuit module of FIG. 2 is employed.

Also, by applying the drive circuit module of the example 2, as shown in FIG. 9, the ceramic board 14 may be separated at a desired portion to form a separation portion 41 so as to make large the degree of freedom of bending, thereby allowing the overall size of the liquid crystal display device to be made smaller.

Figure 10:
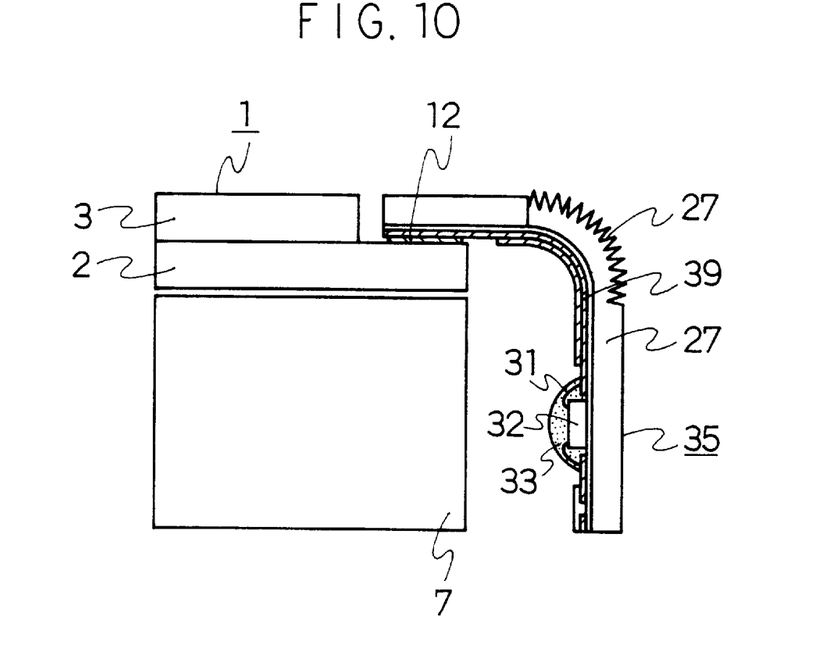
FIG. 10 is a cross sectional view of a liquid crystal display device wherein the driving circuit module of FIG. 3 is employed.
Figure 11:
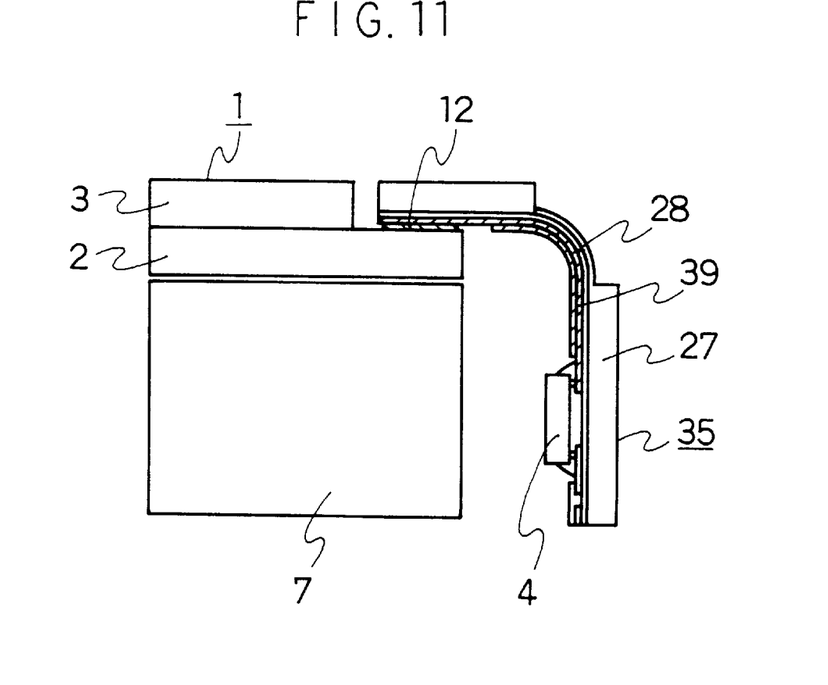
FIG. 11 is a cross sectional view of a liquid crystal display device wherein the driving circuit module of FIG. 3 is employed.

Also, by applying the drive circuit module of the Example 3, as shown in FIGS. 10 and 11, the drive circuit module 35 may be connected to the anisotropy conductive film 12 of the liquid crystal panel 1, and bent at a cutout such as the cut groove 27 or the boring portion 28.

According to the present invention in connection with claims 1 to 7, 22 and 23, there is obtained the drive circuit module in which bending at the cutout allows a change in the direction of the output terminal formed with a fine pitch at a high accuracy and of the carrying section carrying the drive LSI, and the circuit pattern is supported by the flexible insulation layer, thereby keeping a function of the circuit pattern without being cut.

Also, there is obtained the drive circuit module in which the circuit pattern is formed on the board having no flexibility, so that even heating the board, there are little elongation and warpage, and no deviation in the pitch of the output terminal.

According to the present invention in connection with claims 9 to 14, 24 and 25, there is obtained the circuit board in which bending at the cutout allows a change in the direction of the circuit pattern, and the circuit pattern is supported by the flexible insulation layer, thereby keeping a function of the circuit pattern without being cut.

According to the present invention in connection with claims 15 to 21, 26 and 27, the overall size of the liquid crystal display device can be made small by connecting the wiring terminal of the TFT board to the output terminal of the drive circuit module in which bending at the cutout allows a change in the direction of the output terminal formed with a fine pitch at a high accuracy and of the carrying section carrying the drive LSI, and the circuit pattern is supported by the flexible insulation layer, thereby keeping a function of the circuit pattern without being cut.

Also, there is obtained the drive circuit module in which the circuit pattern is formed on the board having no flexibility, so that even heating the board, there are little elongation and warpage, and no deviation in the pitch in the connection of the wiring terminal of the TFT board to the output terminal of the drive circuit module.

According to the present invention in connection with claims 3 and 23, by removing the board in contact with the separation layer, there is obtained the drive circuit module having a large degree of freedom in bending such as bending angle and bending direction.

According to the present invention in connection with claims 11 and 25, by removing the board in contact with the separation layer, there is obtained the circuit board having a large degree of freedom in bending such as bending angle and bending direction.

According to the present invention in connection with claims 17 and 27, the overall size of the liquid crystal display device can be made smaller by the use of the drive circuit module having a large degree of freedom in bending such as bending angle and bending direction obtained by removing the board in contact with the separation layer.

While only certain presently preferred embodiments have been described in detail, as will be apparent with those familiar with the art, certain changes and modifications can be made without departing from the spirit and scope of the invention as defined the following claims.

What is claimed is:

1. A method of manufacturing a drive circuit module comprising steps of:

forming a circuit pattern having a plurality of input terminals and output terminals supported by a flexible insulation film on a rigid board formed of a hard base material;

installing a liquid crystal display drive LSI on the circuit pattern on a carrying section;

providing at least one cutout on a surface opposite to the surface on which said circuit pattern of said board is formed, said at least one cutout being in the form of a counter boring groove; and bending said module at said at least one cutout in a direction in which said output terminal surface and said carrying section surface are different from each other.

2. A method of manufacturing a drive circuit module comprising steps of:

forming a circuit pattern having a plurality of input terminals and output terminals supported by a flexible insulation film;

installing a liquid crystal display drive LSI on the circuit pattern on a carrying section;

providing at least two cutouts spaced from one another on a surface opposite to the surface on which said circuit pattern of said board is formed, said cutouts being in the form of cut grooves; and bending said module at said at least two cutouts in a direction in which said output terminal surface and said carrying section surface are different from each other.

3. A method of manufacturing a liquid crystal display device comprising steps of:

connecting wiring terminals of a TFT board to form wiring terminals connected to a gate electrode wiring and a source electrode wiring of said TFT to an output terminal of a drive circuit module which has a rigid board formed of a hard base material;

forming a circuit pattern on the board having a plurality of input terminals and output terminals supported by a flexible insulation film;

providing a carrying section for carrying a liquid crystal display drive LSI on the circuit pattern;

providing at least one cutout on a surface opposite to the surface on which said circuit pattern of said board is formed, said at least one cutout being in the form of counter boring grooves used for bending said module, thereby making flexible said module in a direction in which said output terminal surface and said carrying section surface are different from each other; and bending said module at said at least one cutout.

4. A method of manufacturing a liquid crystal display device comprising steps of:

connecting wiring terminals of a TFT board to form wiring terminals connected to a gate electrode wiring and a source electrode wiring of said TFT to an output terminal of a drive circuit module which has a rigid board formed of a hard base material;

forming a circuit pattern on the board having a plurality of input terminals and output terminals supported by a flexible insulation film;

providing a carrying section for carrying a liquid crystal display drive LSI on the circuit pattern;

providing at least two cutouts spaced from one another on a surface opposite to the surface on which said circuit pattern of said board is formed, said cutouts being in the form of cut grooves used for bending said module, thereby making flexible said module in a direction in which said output terminal surface and said carrying section surface are different from each other; and bending said module at said at least two cutouts.

* * * * *